(12) United States Patent
Hasegawa et al.

(10) Patent No.: US 11,295,775 B2
(45) Date of Patent: *Apr. 5, 2022

(54) MAGNETIC RECORDING MEDIUM HAVING MAGNETIC LAYER WITH NITRIDE OF CARBON OR HYDRIDE OF CARBON, AND MAGNETIC STORAGE APPARATUS

(71) Applicant: SHOWA DENKO K.K., Tokyo (JP)

(72) Inventors: Kota Hasegawa, Chiba (JP); Katsuaki To, Chiba (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/953,894

(22) Filed: Nov. 20, 2020

(65) Prior Publication Data

US 2021/0098017 A1 Apr. 1, 2021

Related U.S. Application Data

(62) Division of application No. 16/279,143, filed on Feb. 19, 2019, now Pat. No. 10,984,829.

(30) Foreign Application Priority Data

Mar. 23, 2018 (JP) .............................. JP2018-055741

(51) Int. Cl.
*G11B 5/667* (2006.01)
*G11B 5/65* (2006.01)
*G11B 5/66* (2006.01)

(52) U.S. Cl.
CPC .............. *G11B 5/667* (2013.01); *G11B 5/656* (2013.01); *G11B 5/657* (2021.05); *G11B 5/658* (2021.05); *G11B 5/66* (2013.01)

(58) Field of Classification Search
None
See application file for complete search history.

(56) References Cited

U.S. PATENT DOCUMENTS

| 7,531,248 B1 | 5/2009 | Nolan et al. |
| 8,507,114 B2 | 8/2013 | Peng et al. |

(Continued)

FOREIGN PATENT DOCUMENTS

| CN | 104781446 | 7/2015 |
| CN | 105874536 | 8/2016 |

(Continued)

OTHER PUBLICATIONS

Office Action dated Nov. 30, 2020 issued with respect to the related U.S. Appl. No. 16/407,412.

*Primary Examiner* — Kevin M Bernatz
(74) *Attorney, Agent, or Firm* — IPUSA, PLLC

(57) ABSTRACT

A magnetic recording medium includes a nonmagnetic substrate, a soft magnetic underlayer, an orientation control layer, a perpendicular magnetic layer, and a protection layer that are arranged in this order. The perpendicular magnetic layer includes a first magnetic layer and a second magnetic layer that are arranged in this order on the orientation control layer. The first magnetic layer has a granular structure including an oxide at grain boundary parts of magnetic grains, and the second magnetic layer is closest to the protection layer among layers within the perpendicular magnetic layer, and includes magnetic grains made of a CoCrPt alloy, and a nitride of carbon or a hydride of carbon.

20 Claims, 3 Drawing Sheets

(56) References Cited

U.S. PATENT DOCUMENTS

| | | |
|---|---|---|
| 8,580,410 B2 | 11/2013 | Onoue |
| 8,623,528 B2 | 1/2014 | Umezawa et al. |
| 9,406,329 B1 | 8/2016 | Ho et al. |
| 9,607,644 B2 | 3/2017 | Moriya |
| 10,984,829 B2 * | 4/2021 | Hasegawa ............... C23C 16/28 |
| 2007/0218316 A1 | 9/2007 | Inomata |
| 2007/0248843 A1 | 10/2007 | Wu et al. |
| 2010/0159285 A1 | 6/2010 | Peng et al. |
| 2010/0189886 A1 | 7/2010 | Peng |
| 2011/0097600 A1 | 4/2011 | Onoue et al. |
| 2012/0028076 A1 | 2/2012 | Iwasaki et al. |
| 2012/0250186 A1 | 10/2012 | Irisawa et al. |
| 2013/0071695 A1 | 3/2013 | Peng et al. |
| 2014/0104724 A1 | 4/2014 | Shiroishi et al. |
| 2015/0138939 A1 | 5/2015 | Hellwig et al. |
| 2015/0194175 A1 | 7/2015 | Chen et al. |
| 2016/0118071 A1 | 4/2016 | Hirotsune et al. |
| 2016/0267934 A1 | 9/2016 | Furuta et al. |
| 2017/0365279 A1 | 12/2017 | Fukushima et al. |
| 2018/0166100 A1 | 6/2018 | Hasegawa et al. |
| 2018/0174605 A1 | 6/2018 | Hasegawa et al. |
| 2019/0295583 A1 | 9/2019 | Hasegawa et al. |

FOREIGN PATENT DOCUMENTS

| | | |
|---|---|---|
| JP | H01-107316 | 4/1989 |
| JP | 2006-277950 | 10/2006 |
| JP | 2007-257679 | 10/2007 |
| JP | 2009-238298 | 10/2009 |
| JP | 2010-176829 | 8/2010 |
| JP | 2011-192326 | 9/2011 |

* cited by examiner

FIG.4

| | SECOND MAGNETIC LAYER | SNR [dB] | NUMBER OF CORROSION SPOTS PER SURFACE |
|---|---|---|---|
| EI1 | 70(Co11Cr18Pt)–30(CN$_{2.5}$) | 8.1 | 30 |
| EI2 | 70(Co11Cr18Pt)–30(CH$_{3.5}$) | 8.2 | 30 |
| EI3 | 70(Co10Cr20Pt14B)–30(CN$_{2.5}$) | 8.2 | 30 |
| EI4 | 70(Co10Cr20Pt14B)–30(CH$_{3.5}$) | 8.2 | 30 |
| EI5 | 70[95(Co11Cr14Pt)–5(CN$_{2.1}$)]–30(CN$_{2.5}$) | 8.3 | 25 |
| EI6 | 70[95(Co11Cr14Pt)–5(CH$_{3.1}$)]–30(CH$_{3.5}$) | 8.3 | 25 |
| CE1 | Co10Cr20Pt14B | 7.6 | 40 |
| CE2 | 92(Co11Cr18Pt)–5(SiO$_2$)–3(TiO$_2$) | 7.1 | 100 |
| CE3 | 70(Co11Cr18Pt)–30C | 7.7 | 35 |

MAGNETIC RECORDING MEDIUM HAVING MAGNETIC LAYER WITH NITRIDE OF CARBON OR HYDRIDE OF CARBON, AND MAGNETIC STORAGE APPARATUS

CROSS-REFERENCE TO RELATED APPLICATIONS

This application is a Divisional Application of U.S. patent application Ser. No. 16/279,143 filed on Feb. 19, 2019, which is based upon and claims priority to Japanese Patent Application No. 2018-055741 filed on Mar. 23, 2018, the entire contents of which are incorporated herein by reference.

BACKGROUND OF THE INVENTION

1. Field of the Invention

The present invention relates to a magnetic recording medium, and a magnetic storage apparatus including the magnetic recording medium.

2. Description of the Related Art

Recently, the recording density of a magnetic recording medium that is used in a HDD (Hard Disk Drive) has increased considerably. Hence, the storage capacity of the HDD that is one type of magnetic storage apparatus, has increased accordingly, and it is believed that this tendency for the recording density and the storage capacity to increase will continue into the future. For this reason, there is active research to develop a magnetic recording medium having a high recording density, and a magnetic head that records information on and reproduces the information from the magnetic recording medium having the high recording density.

The magnetic recording medium used in the magnetic storage apparatus that is presently commercially available is a perpendicular magnetic recording medium. The perpendicular magnetic recording medium includes a perpendicular magnetic layer having an axis of easy magnetization primarily oriented perpendicularly to a surface of a nonmagnetic substrate. The perpendicular magnetic layer has a hcp (hexagonal close-packed) structure, and a (0002) face that is primarily oriented parallel with respect to the surface of the nonmagnetic substrate. In the perpendicular magnetic recording medium, even when the recording density is increased, effects of demagnetization at boundary regions between recording bits are small, and clear boundaries of the recording bits are formed, to the improve the noise property or SNR (Signal-to-Noise Ratio). Further, in the perpendicular magnetic recording medium, a decrease in a volume of the recording bits due to the increase in the recording density is small, and the thermal stability can be improved. For this reason, various structures have been proposed for the perpendicular magnetic recording medium.

A magnetic layer having a granular structure is used for the perpendicular magnetic layer. The magnetic layer having the granular structure includes a nonmagnetic nonmetallic material at grain boundary parts of magnetic grains. Hence, the nonmagnetic nonmetallic material physically isolates the magnetic grains, to reduce magnetic interaction between the magnetic grains, and reduce formation of a zigzag magnetic domain wall at a transition region of the recording bit. As a result, it is possible to improve the noise property.

Examples of the nonmagnetic nonmetallic material include oxides, nitrides, carbides, borides, or the like, as proposed in Japanese Laid-Open Patent Publication No. 2007-257679, for example.

However, cobalt or the like easily precipitates into the magnetic layer having the granular structure, to deteriorate the corrosion resistance of the magnetic recording medium.

For this reason, a magnetic recording medium proposed in Japanese Laid-Open Patent Publication No. 2006-277950, for example, is provided with two magnetic layers, and one of the two magnetic layers arranged closer to a protection layer has a non-granular structure.

However, when the magnetic layer having the non-granular structure is provided, the noise property of the magnetic recording medium deteriorates.

SUMMARY OF THE INVENTION

Embodiments of the present invention can provide a magnetic recording medium and a magnetic storage apparatus, which can obtain superior noise property and corrosion resistance.

According to one aspect of embodiments of the present invention, a magnetic recording medium includes a nonmagnetic substrate, a soft magnetic underlayer, an orientation control layer, a perpendicular magnetic layer, and a protection layer that are arranged in this order, wherein the perpendicular magnetic layer includes a first magnetic layer and a second magnetic layer that are arranged in this order on the orientation control layer, wherein the first magnetic layer has a granular structure including an oxide at grain boundary parts of magnetic grains, and wherein the second magnetic layer is closest to the protection layer among layers within the perpendicular magnetic layer, and includes magnetic grains made of a CoCrPt alloy, and a nitride of carbon or a hydride of carbon.

According to another aspect of the embodiments of the present invention, a magnetic storage apparatus includes the magnetic recording medium referred above; and a magnetic head configured to write information to and read information from the magnetic recording medium.

Other objects and further features of the present invention will be apparent from the following detailed description when read in conjunction with the accompanying drawings.

BRIEF DESCRIPTION OF THE DRAWINGS

FIG. 4 is a table illustrating evaluation results of noise property and corrosion resistance for exemplary implementations and comparison examples.

DESCRIPTION OF THE PREFERRED EMBODIMENTS

Figure 1:
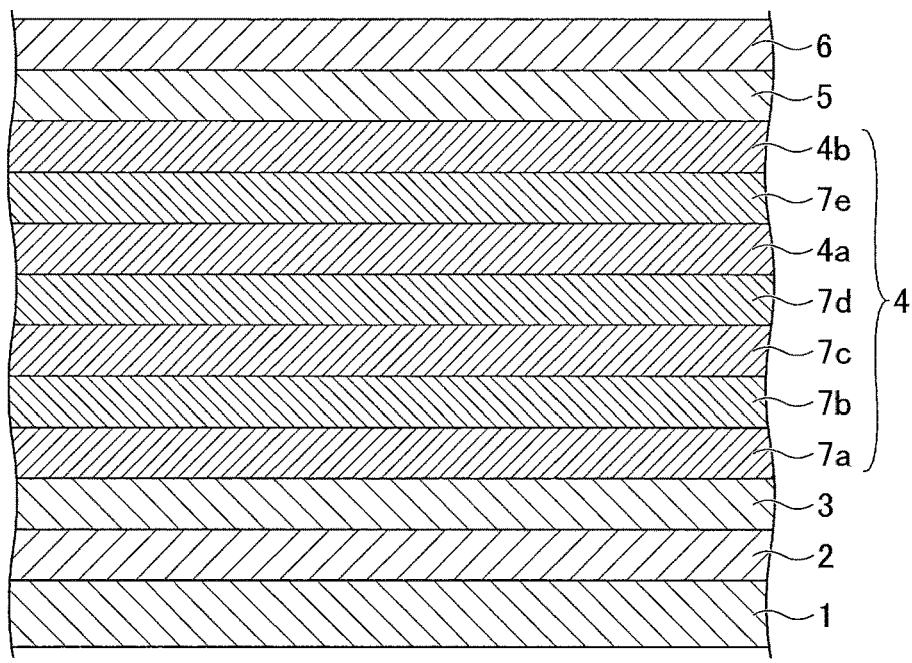
FIG. 1 is a cross sectional view illustrating an example of a structure of a magnetic recording medium in one embodiment of the present invention.

Embodiments and exemplary implementations of a magnetic recording medium and a magnetic storage apparatus according to the present invention will be described, by referring to the drawings. In each of the embodiments and exemplary implementations, the configuration, arrangements or positions, materials, and amounts (at % or mol %) of elements used in the magnetic recording medium or the magnetic storage apparatus may be appropriately modified, unless indicated otherwise.

FIG. 1 is a cross sectional view illustrating an example of a structure of the magnetic recording medium in one embodiment of the present invention.

A magnetic recording medium 10 illustrated in FIG. 1 includes a nonmagnetic substrate 1, a soft magnetic underlayer 2, an orientation control layer 3, a perpendicular magnetic layer 4, a protection layer 5, and a lubricant layer 6 that are arranged in this order.

The perpendicular magnetic layer 4 has a hcp structure, and a (0002) face that is primarily oriented parallel with respect to a surface of the nonmagnetic substrate 1. For this reason, an axis of easy magnetization of the perpendicular magnetic layer 4 is primarily oriented perpendicularly to the surface of the nonmagnetic substrate 1.

Figure 2:
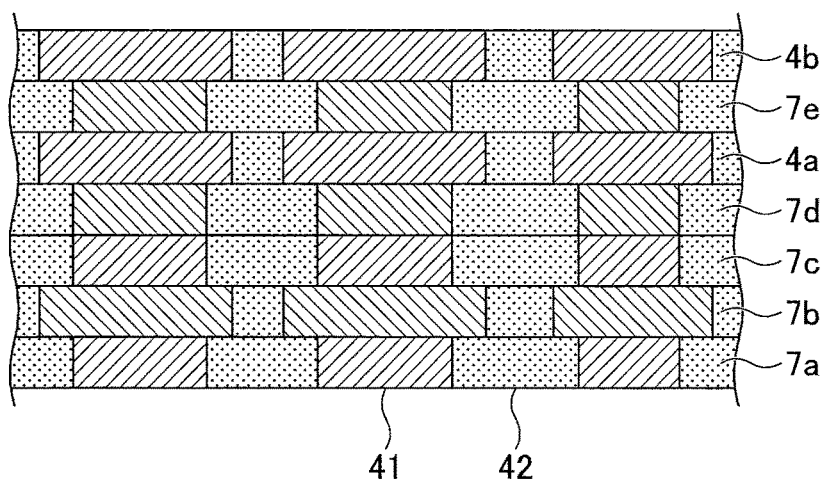
FIG. 2 is cross sectional view illustrating an example of a structure of a perpendicular magnetic layer illustrated in FIG. 1.

The perpendicular magnetic layer 4 includes a first magnetic layer 4a, and a second magnetic layer 4b. The first magnetic layer 4a is arranged on a side closer to the orientation control layer 3 than the second magnetic layer 4b. In addition, the perpendicular magnetic layer 4 includes arbitrary magnetic or nonmagnetic layers 7a, 7b, 7c, 7d, and 7e, in addition to the first magnetic layer 4a and the second magnetic layer 4b. In the perpendicular magnetic layer 4, magnetic or nonmagnetic grains 41 form a columnar crystal that is continuous from lower to upper layers, as illustrated in FIG. 2.

In the first magnetic layer 4a and the second magnetic layer 4b, the reference numeral "41" denotes a magnetic grain. In a case in which the layers 7a, 7b, 7c, 7d, and 7e are magnetic layers, the reference numeral "41" denotes a magnetic grain. On the other hand, in a case in which the layers 7a, 7b, 7c, 7d, and 7e are nonmagnetic layers, the reference numeral "41" denotes a nonmagnetic grain.

The first magnetic layer 4a has a granular structure, including an oxide in grain boundary parts 42 of the magnetic grains 41. For this reason, the magnetic grains 41 in the first magnetic layer 4a are easily isolated and refined, to improve the noise property of the magnetic recording medium 10.

In a case in which the first magnetic layer 4a is formed by sputtering, the oxide has a highest reactivity among nonmagnetic nonmetallic materials forming the grain boundary parts 42. For this reason, when the oxide is used as the nonmagnetic nonmetallic material, it is possible to easily form the first magnetic layer 4a.

In addition, the second magnetic layer 4b is a magnetic layer closest to the protection layer 5 within the perpendicular magnetic layer 4. The second magnetic layer 4b preferably has a granular structure including a nitride of carbon (C) or a hydride of carbon (C), at the grain boundary parts 42 of the magnetic grains 41 made of a CoCrPt alloy. For this reason, similarly as in the case of the first magnetic layer 4a, the magnetic grains 41 made of the CoCrPt alloy, in the second magnetic layer 4b, are easily isolated and refined, to improve the noise property of the magnetic recording medium 10.

The nitride of carbon or the hydride of carbon is stable compared to the oxide, and is uneasily oxidized. Further, the nitride of carbon or the hydride of carbon can prevent diffusion of the oxide from other layers. For this reason, it is possible to improve the corrosion resistance of the magnetic recording medium 10.

The second magnetic layer 4b does not need to have the granular structure, and need only include the magnetic grains made of the CoCrPt alloy, and the nitride of carbon or the hydride of carbon. Hence, the magnetic grains made of the CoCrPt alloy are isolated and refined, to improve the noise property of the magnetic recording medium 10.

For example, the second magnetic layer 4b may include the nitride of carbon or the hydride of carbon precipitated into a periphery of the magnetic grains 41. Alternatively, the nitride of carbon or the hydride of carbon may precipitate into the magnetic grains 41.

A molar ratio of the oxide included in the first magnetic layer 4a and forming the grain boundary parts 42, with respect to a magnetic material forming the magnetic grains 41, is preferably 3% or higher and 18% or lower, and more preferably 6% or higher and 13% or lower. In a case in which the molar ratio of the oxide included in the first magnetic layer 4a and forming the grain boundary parts 42, with respect to the magnetic material forming the magnetic grains 41, is 3% or higher and 18% or lower, the noise property of the magnetic recording medium 10 improves.

The oxide forming the grain boundary parts 42 included in the first magnetic layer 4a is preferably an oxide of an element selected from a group consisting of silicon (Si), chromium (Cr), titanium (Ti), tantalum (Ta), aluminum (Al), yttrium (Y), boron (B), magnesium (Mg), tungsten (W), and cobalt (Co).

Examples of the magnetic material forming the magnetic grains 41 included in the first magnetic layer 4a include CoCrPt—$SiO_2$, CoCrPtNb—$Cr_2O_3$, CoCrPt—$Ta_2O_5$, CoCrPt—$Cr_2O$—$TiO_2$, CoCrPt—$Cr_2O_3$—$SiO_2$, COCrPt—$Cr_2O_3$—$SiO_2$—$TiO_2$, CoCrPtMo—$TiO_2$, CoCrPtW—$TiO_2$, CoCrPtB—$Al_2O_3$, CoCrPtTaNd—MgO, CoCrPtBCu—$Y_2O_3$, CoCrPtRu—$SiO_2$, or the like, for example.

The second magnetic layer 4b preferably includes no oxide. In this case, the corrosion resistance of the magnetic recording medium 10 improves.

The second magnetic layer 4b may be formed by forming a magnetic layer that includes magnetic grains made of the CoCrPt alloy, and carbon, by sputtering, for example, and thereafter subjecting the magnetic layer to a nitriding treatment or a hydriding treatment, so that at least a part of the carbon included in the magnetic layer is nitrided or hydrided.

A known method may be used for a method of subjecting the magnetic layer to the nitriding treatment. From a viewpoint of reducing damage to the magnetic layer, the method of subjecting the magnetic layer to the nitriding treatment preferably exposes the magnetic layer to reactive nitrogen plasma.

A known method may be used for a method of subjecting the magnetic layer to the hydriding treatment. From a viewpoint of reducing damage to the magnetic layer, the method of subjecting the magnetic layer to the hydriding preferably exposes the magnetic layer to reactive hydrogen plasma.

In addition, the second magnetic layer 4b may be formed by forming a magnetic layer that includes magnetic grains made of the CoCrPt alloy, and carbon, by reactive sputtering, so that nitrogen or hydrogen is introduced into a sputtering gas.

Examples of CoCrPt alloy materials forming the magnetic grains included in the second magnetic layer 4b include CoCrPt alloys, CoCrPtB alloys, CoCrPtTa alloys, CoCrPtTi alloys, CoCrPtZr alloys, CoCrPtAl alloys, CoCrPtSi alloys, or the like, for example.

The CoCrPt alloy forming the magnetic grains preferably includes no boron, for the following reasons. That is, in a case in which a method of manufacturing the magnetic recording medium 10 includes a heat treatment and the CoCrPt alloy forming the magnetic grains include boron, the boron within the magnetic grains made of the CoCrPt alloy thermally diffuses to change the composition. In this case, the grain boundary parts of the magnetic grains easily become unclear, and an electromagnetic conversion property of the magnetic recording medium 10 may deteriorate.

Examples of the material forming the second magnetic layer 4b include CoCrPt—CNx, CoCrPtB—CNx, CoCrPtTa—CNx, CoCrPtTi—CNx, CoCrPtZr—CNx, CoCrPtAl—CNx, CoCrPtSi—CNx, CoCrPt—CHx, CoCrPtB—CHx, CoCrPtTa—CHx, CoCrPtTi—CHx, CoCrPtZr—CHx, CoCrPtAl—CHx, CoCrPtSi—CHx, or the like, for example, where "x" is an arbitrary number, and each of "—CNx" and "—CHx" may be any one of crystalline structure, amorphous structure, and a mixture of crystalline and amorphous structures.

A content of the nitride of carbon or the hydride of carbon within the second magnetic layer 4b is preferably in a range of 1 mol % to 50 mol %, and is more preferably in a range of 10 mol % to 40 mol %. In a case in which the content of the nitride of carbon or the hydride of carbon within the second magnetic layer 4b is in the range of 1 mol % to 50 mol %, the noise property of the magnetic recording medium 10 improves.

In a case in which the grain boundary parts of the magnetic layer having the granular structure is formed by an oxide of silicon, chromium, titanium, or the like, a content of the oxide within the magnetic layer in most cases is approximately 10 mol %. However, because the nitride of carbon or the hydride of carbon included within the second magnetic layer 4b is formed by an element having a small atomic weight or mass, the content [mol %] of the oxide within the magnetic layer tends to become large.

The magnetic grains made of the CoCrPt alloy preferably includes the nitride of carbon or the hydride of carbon in a range of 1 mol % to 8 mol %. In this case, the corrosion resistance of the magnetic grains made of the CoCrPt alloy improves, to improve the corrosion resistance of the magnetic recording medium 10.

The perpendicular magnetic layer 4 includes the arbitrary magnetic or nonmagnetic layers 7a, 7b, 7c, 7d, and 7e. However, the layers 7a and 7c are preferably magnetic layers, and the layers 7b, 7d, and 7e are preferably nonmagnetic layers.

The number of arbitrary magnetic or nonmagnetic layers is not limited to five, and the number may be increased or decreased if necessary.

The arbitrary magnetic layer preferably has the granular structure including the oxide in the grain boundary parts 42 of the magnetic grains 41, similarly to the first magnetic layer 4a.

The material forming the arbitrary magnetic layer is the same as the material forming the first magnetic layer 4a.

The arbitrary nonmagnetic layer is provided between the magnetic layers to control an exchange coupling between the magnetic layers.

The material forming the arbitrary nonmagnetic layer preferably has the hcp structure.

Examples of the material forming the arbitrary nonmagnetic layer include Ru, Ru alloys, RuCo alloys, CoCr alloys, and CoCrX alloys, for example, where "X" is one or more elements selected from a group consisting of Pt, Ta, Zr, Re, Ru, Cu, Nb, Ni, Mn, Ge, Si, O, N, W, Mo, Ti, V, Zr, and B.

In addition, the arbitrary nonmagnetic layer may have the granular structure.

A thickness of the arbitrary nonmagnetic layer needs to be in a range such that ferromagnetic coupling of the first magnetic layer 4a, the second magnetic layer 4b, and the arbitrary magnetic layers will not be cut off completely.

Next, other structures of the magnetic recording medium 10 will be described.

A metal substrate formed by a metal material such as aluminum, aluminum alloys, or the like, may be used for the nonmagnetic substrate 1. Alternatively a nonmetallic substrate formed by a nonmetallic material such as glass, ceramics, silicon, silicon carbide, carbon, or the like, may be used for the nonmagnetic substrate 1.

Each of the metal substrate and the nonmetallic substrate may have a NiP layer or a NiP alloy layer formed on a surface thereof by plating or sputtering.

The soft magnetic underlayer 2 is provided to increase a perpendicular component of magnetic flux generated from a magnetic head with respect to the nonmagnetic substrate, and to more strongly pin the axis of easy magnetization of the perpendicular magnetic layer 4 in a direction perpendicular to the nonmagnetic substrate 1. In a case in which a single-pole head for perpendicular recording is used as the magnetic head that records information on the magnetic recording medium 10, the action of the soft magnetic underlayer 2 becomes more notable.

The material forming the soft magnetic underlayer 2 is not limited to a particular material. Examples of the material forming the soft magnetic underlayer 2 include soft magnetic materials including Fe, Ni, and Co.

Examples of the soft magnetic material include CoFe alloys, FeCo alloys, FeNi alloys, FeAl alloys, FeCr alloys, FeTa alloys, FeMg alloys, FeZr alloys, FeC alloys, FeN alloys, FeSi alloys, FeP alloys, FeNb alloys, FeHf alloys, FeB alloys, or the like, for example. The CoFe alloys include CoFeTaZr, CoFeZrNb, or the like. The FeCo alloys include FeCo, FeCoV, or the like. The FeNi alloys include FeNi, FeNiMo, FeNiCr, FeNiSi, or the like. The FeAl alloys, include FeAl, FeAlSi, FAlSiCr, FeAlSiTiRu, FeAlO, or the like. The FeCr alloys include FeCr, FeCrTi, FeCrCu, or the like. The FeTa alloys include FeTa, FeTaC, FeTaN, or the like. The FeMg alloys include FeMgO, or the like. The FeZr alloys include FeZrN, or the like.

The soft magnetic underlayer 2 is preferably formed by two soft magnetic layers sandwiching a Ru layer. The Ru layer preferably has a thickness adjusted to a range of 0.4 nm to 1.0 nm, or a range of 1.6 nm to 2.6 nm. In this case, the two soft magnetic layers form an AFC (Anti-Ferromagnetic Coupling) structure, to thereby reduce the so-called spike noise.

An adhesion layer (or bonding layer) is preferably provided between the nonmagnetic substrate 1 and the soft magnetic underlayer 2. In this case, the corrosion resistance of the magnetic recording medium 10 is improved.

Examples of the material forming the adhesion layer include Cr, Cr alloys, Ti, Ti alloys, or the like, for example. The adhesion layer preferably has a thickness of 30 Å or greater.

The orientation control layer 3 controls the orientation of the perpendicular magnetic layer 4. In other words, the orientation control layer 3 is provided to primarily orient the (0002) face of the perpendicular magnetic layer 4 having the hcp structure, parallel with respect to the surface of the nonmagnetic substrate 1. Hence, the magnetic grains 41 of the perpendicular magnetic layer 4 are refined, to improve the noise property of the magnetic recording medium 10.

The material forming the orientation control layer 3 preferably has the hcp structure, a fcc (face-centered cubic) structure, or an amorphous structure.

Examples of the material forming the orientation control layer 3 include Ru alloys, Ni alloys, Co alloys, Pt alloys, Cu alloys, or the like, for example.

The orientation control layer 3 may be formed by a plurality of orientation control layers. In this case, the orientation control layer 3 arranged on the soft magnetic underlayer 2 preferably has a multi-layer structure including layers of Ni alloy and Ru alloy, a multi-layer structure including layers of Co alloy and Ru alloy, or a multi-layer structure including layers of Pt alloy and Ru alloy, for example.

The protection layer 5 is provided to prevent corrosion of the perpendicular magnetic layer 4, and to prevent damage to the surface of the magnetic recording medium 10 when the magnetic head contacts the magnetic recording medium 10.

Known materials may be used as the material forming the protection layer 5. Examples of the material forming the protection layer 5 include hard carbon, or the like, for example.

The protection layer 5 preferably has a thickness of 1 nm to 10 nm. In this case, a distance between the magnetic head and the magnetic recording medium 10 can be reduced, so that it is possible to provide the magnetic recording medium 10 suited for the high-density recording.

Examples of the material forming the lubricant layer include lubricants such as perfluoropolyether, fluorinated alcohol, fluorinated carboxylic acid, or the like, for example.

Figure 3:
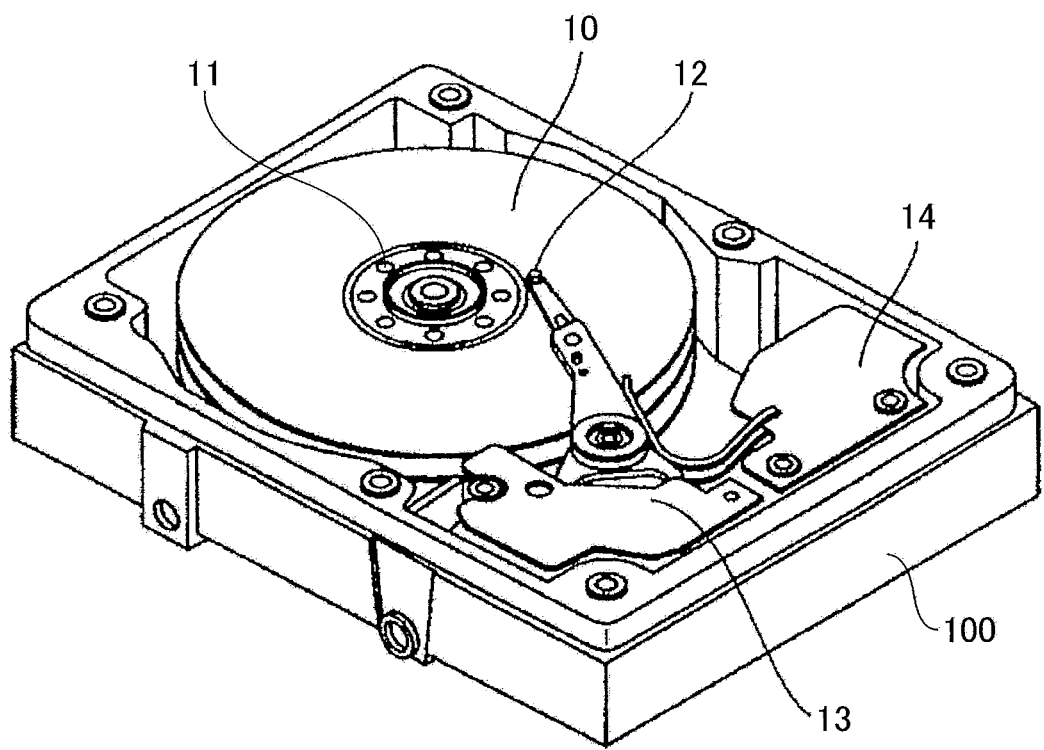
FIG. 3 is a perspective view illustrating an example of a magnetic storage apparatus in one embodiment of the present invention.

FIG. 3 is a perspective view illustrating an example of a magnetic storage apparatus in one embodiment of the present invention.

The magnetic storage apparatus illustrated in FIG. 3 includes at least one magnetic recording medium 10, a driving mechanism 11 that drives the magnetic recording medium 10 in a rotating direction, at least one magnetic head 12, a head moving mechanism 13 that moves the magnetic head 12 relative to the magnetic recording medium 10, and a signal processor 14 that are accommodated within a casing 100. The magnetic recording medium 10 has the structure illustrated in FIG. 1. The magnetic head 12 records information on and reproduces information from the magnetic recording medium 10.

The signal processor 14 processes input data received from an outside into a recording signal that is supplied to the magnetic head 12. In addition, the signal processor 14 processes a reproduced signal output from the magnetic head 12 into data output to the outside.

The magnetic head 12 may be formed by a magnetic head suited for the high-density recording, and including as a reproducing element a GMR (Giant Magneto-Resistive) element that utilizes the GMR effect.

Next, exemplary implementations according to the present invention, together with comparison examples, will be described. However, the present invention is not limited to these exemplary implementations, and various variations, modifications, and substitutions may be made without departing from the scope of the present invention.

(Exemplary Implementation EI1)

The magnetic recording medium is manufactured by the following method.

First, a cleaned nonmagnetic substrate (manufactured by HOYA Corporation) made of glass and having an outer diameter of 2.5 inches is accommodated within a deposition chamber of a DC magnetron sputtering apparatus C-3040 (manufactured by CANON ANELVA CORPORATION), and the deposition chamber is evacuated to an ultimate pressure of $1\times10^{-5}$ Pa.

Next, a Cr50Ti {Ti-content of 50 at %, remainder Cr} target is used to form an adhesion layer to a thickness of 10 nm on the nonmagnetic substrate.

Next, a Co20Fe5Zr5Ta {Fe-content of 20 at %, Zr-content of 5 at %, Ta-content of 5 at %, and remainder Co} target is used to form a soft magnetic layer to a thickness of 25 nm on the adhesion layer by setting a temperature of the nonmagnetic substrate to 100° C.

Next, a Ru target is used to form a Ru layer to a thickness of 0.7 nm on the soft magnetic layer.

Next, the Co20Fe5Zr5Ta target is used to form a soft magnetic underlayer to a thickness of 25 nm on the Ru layer by setting the temperature of the nonmagnetic substrate to 100° C.

Next, a Ni6W {W-content of 6 at %, and remainder Ni} target and a Ru target are used to respectively form a Ni-6W layer having a thickness of 5 nm and a Ru layer having a thickness of 20 nm, in this order on the soft magnetic underlayer, to form an orientation control layer.

Next, a 91(Co15Cr18Pt)-6($SiO_2$)-3 ($TiO_2$) {alloy-content of 91 mol % of alloy including Cr-content of 15 at %, Pt-content of 18 at %, and remainder Co, $SiO_2$-content of 6 mol %, and $TiO_2$-content of 3 mol %} target is used to form a magnetic layer having a granular structure to a thickness of 9 nm on the orientation control layer, with a sputtering pressure set to 2 Pa.

Next, a 88(Co30Cr)-12(TiO2) {alloy-content of 88 mol % of alloy including Cr-content of 30 at %, and remainder Co, and TiO2-content of 12 mol %} target is used to form a nonmagnetic layer having a granular structure to a thickness of 0.3 nm on the magnetic layer.

Next, a 92(Co11Cr18Pt)-5($SiO_2$)-3($TiO_2$) {alloy-content of 92 mol % of alloy including Cr-content of 11 at %, Pt-content of 18 at %, and remainder Co, $SiO_2$-content of 5 mol %, and $TiO_2$-content of 3 mol %} target is used to form a first magnetic layer having a granular structure to a thickness of 6 nm on the nonmagnetic layer, with the sputtering pressure set to 2 Pa.

Next, a Ru target is used to form a nonmagnetic layer having a non-granular structure to a thickness of 0.3 nm on the first magnetic layer.

Next, a 70(Co11Cr18Pt)-30C {alloy-content of 70 mol % of alloy including Cr-content of 11 at %, Pt-content of 18 at %, and remainder Co, and C-content of 30 mol %} target is used to form a magnetic layer having a granular structure to a thickness of 10 nm on the nonmagnetic layer provided on the first magnetic layer, with the sputtering pressure set to 0.6 Pa.

Next, the magnetic layer having the granular structure and the thickness of 10 nm is exposed to reactive nitrogen plasma for 20 seconds to subject this magnetic layer to a nitriding treatment, to form a second magnetic layer having the granular structure and made of 70(Co11Cr18Pt)-30 ($CN_{2.5}$) {alloy-content of 70 mol % of alloy including Cr-content of 11 at %, Pt-content of 18 at %, and remainder Co, and $CN_{2.5}$-content of 30 mol %}. The reactive nitrogen plasma is generated by applying a RF (Radio Frequency) power of 500 W to a mixture gas in which nitrogen gas content is 5 vol % and argon gas content is 95 vol %. An amount of nitridization of C is measured using a SIMS (Secondary Ion Mass Spectrometer). In addition, a structure of the nitride of C is analyzed using a TEM (Transmission Electron Microscope), and found to be an amorphous structure.

Next, ion beam epitaxy is used to form a protection layer to a thickness of 2 nm on the second magnetic layer.

Next, dipping is used to form a lubricant layer made of perfluoropolyether on the protection layer, to manufacture the magnetic recording medium.

(Exemplary Implementation IE2)

When forming the second magnetic layer, the magnetic layer having the granular structure and the thickness of 10 nm is exposed to reactive hydrogen plasma for 10 seconds to subject this magnetic layer to a hydriding treatment, to form a second magnetic layer having a granular structure and made of 70(Co11Cr18Pt)-30(CH$_{3.5}$) {alloy-content of 70 mol % of alloy including Cr-content of 11 at %, Pt-content of 18 at %, and remainder Co, and CH$_{3.5}$-content of 30 mol %}. Otherwise, the magnetic recording medium is manufactured similarly to the exemplary implementation IE1. The reactive hydrogen plasma is generated by applying a RF power of 500 W to a mixture gas in which hydrogen gas content is 8 vol % and argon gas content is 92 vol %. An amount of hydrization of C is measured using the SIMS. In addition, a structure of the hydride of C is analyzed using the TEM, and found to be an amorphous structure.

(Exemplary Implementation EI3)

When forming the second magnetic layer, a 70(Co10Cr20Pt14B)-30C target is used to form a magnetic layer having a granular structure and made of 70(Co10Cr20Pt14B)-30(CN$_{2.5}$) {alloy-content of 70 mol % of alloy including Cr-content of 10 at %, Pt-content of 20 at %, B-content of 14 at %, and remainder Co, and CN$_{2.5}$-content of 30 mol %}. Otherwise, the magnetic recording medium is manufactured similarly to the exemplary implementation IE1. A structure of the nitride of C is analyzed using the TEM, and found to be an amorphous structure.

(Exemplary Implementation EI4)

When forming the second magnetic layer, a 70(Co10Cr20Pt14B)-30C target is used to form a magnetic layer having a granular structure and made of 70(Co10Cr20Pt14B)-30(CH$_{3.5}$) {alloy-content of 70 mol % of alloy including Cr-content of 10 at %, Pt-content of 20 at %, B-content of 14 at %, and remainder Co, and CH$_{3.5}$-content of 30 mol %}. Otherwise, the magnetic recording medium is manufactured similarly to the exemplary implementation IE2. A structure of the nitride of C is analyzed using the TEM, and found to be an amorphous structure.

(Exemplary Implementation EI5)

When forming the second magnetic layer, a 70[95(Co11Cr14Pt)-5(CN$_{2.1}$)]-30C {alloy-content of 70 mol % of alloy that includes 95 mol % of a first alloy including Cr-content of 11 at %, Pt-content of 14 at %, and remainder Co, and 5 mol % of a second alloy including CN$_{2.1}$, and a C-content of 30 mol %} target is used to form a magnetic layer having a granular structure and made of 70[95(Co11Cr14Pt)-5(CN$_{2.1}$)]-30(CN$_{2.5}$) {alloy-content of 70 mol % of alloy that includes 95 mol % of a first alloy including Cr-content of 11 at %, Pt-content of 14 at %, and remainder Co, and 5 mol % of a second alloy including CN$_{2.1}$, and a CN$_{2.5}$-content of 30 mol %}. Otherwise, the magnetic recording medium is manufactured similarly to the exemplary implementation IE1. A structure of the nitride of C is analyzed using the TEM, and found to be an amorphous structure.

(Exemplary Implementation IE6)

When forming the second magnetic layer, a 70[95(Co11Cr14Pt)-5(CH$_{3.1}$)]-30C {alloy-content of 70 mol % of alloy that includes 95 mol % of a first alloy including Cr-content of 11 at %, Pt-content of 14 at %, and remainder Co, and 5 mol % of a second alloy including CH$_{3.1}$, and a C-content of 30 mol %} target is used to form a magnetic layer having a granular structure and made of 70[95(Co11Cr14Pt)-5(CH$_{3.1}$)]-30(CH$_{3.5}$) {alloy-content of 70 mol % of alloy that includes 95 mol % of a first alloy including Cr-content of 11 at %, Pt-content of 14 at %, and remainder Co, and 5 mol % of a second alloy including CH$_{3.1}$, and a CH$_{3.5}$-content of 30 mol %}. Otherwise, the magnetic recording medium is manufactured similarly to the exemplary implementation IE2. A structure of the nitride of C is analyzed using the TEM, and found to be an amorphous structure.

Comparison Example CE1

When forming the second magnetic layer, a Co10Cr20Pt14B target is used, and no nitriding treatment is performed, to form a magnetic layer having a non-granular structure. Otherwise, the magnetic recording medium is manufactured similarly to the exemplary implementation IE1.

Comparison Example CE2

When forming the second magnetic layer, a 92(Co11Cr18Pt)-5(SiO$_2$)-3(TiO$_2$) target is used, and no nitriding treatment is performed, to form a magnetic layer having a granular structure. Otherwise, the magnetic recording medium is manufactured similarly to the exemplary implementation IE1.

Comparison Example CE3

When forming the second magnetic layer, no nitriding treatment is performed, to form a magnetic layer having a granular structure. Otherwise, the magnetic recording medium is manufactured similarly to the exemplary implementation IE1.

Next, the noise property and the corrosion resistance of the magnetic recording media according to the exemplary implementations EI1 to EI6 and the comparison examples CE1 to CE3 are evaluated.

(Noise Property)

A read-write analyzer RWA1632 and a spin-stand S1701MP manufactured by Guzik Technical Enterprises are used to measure the SNR [dB] of the magnetic recording media, to evaluate the noise property of the magnetic recording media.

(Corrosion Resistance)

Each magnetic recording medium is left to stand for 96 hours in an environment of 90° C. and 90% RH. Thereafter, an optical surface analyzer is used to count the number of corrosion spots generated per surface, on the surface of each magnetic recording medium, to evaluate the corrosion resistance. A detection accuracy of the corrosion spot is set to a diameter of 5 μm or greater.

FIG. 4 is a table illustrating evaluation results of noise property and corrosion resistance for the exemplary implementations EI1 to EI6 and the comparison examples CE1 to CE3.

It was confirmed from the table of FIG. 4 that the magnetic recording media according to the exemplary implementations IE1 to IE6 have superior noise property and superior corrosion resistance.

On the other hand, it was confirmed from the table of FIG. 4 that the magnetic recording medium according to the comparison example CE1 has a poor noise property because the second magnetic layer does not include the nitride of carbon nor the hydride of carbon.

It was confirmed from the table of FIG. 4 that the magnetic recording medium according to the comparison example CE2 has an extremely poor corrosion resistance because the second magnetic layer does not include the nitride of carbon nor the hydride of carbon, and includes an oxide instead.

It was confirmed from the table of FIG. 4 that the magnetic recording medium according to the comparison example CE3 has a poor corrosion resistance because the second magnetic layer does not include the nitride of carbon nor the hydride of carbon, and includes carbon instead.

Hence, according to the embodiments an exemplary implementations described above, it is possible to provide a magnetic recording medium and a magnetic storage apparatus, which can obtain superior noise property and corrosion resistance.

Although the embodiments and the exemplary implementations are numbered with, for example, "first," "second," "third," etc., the ordinal numbers do not imply priorities of the embodiments and the exemplary implementations.

Further, the present invention is not limited to these embodiments and exemplary implementations, but various variations and modifications may be made without departing from the scope of the present invention.

What is claimed is:

1. A magnetic recording medium comprising:
a nonmagnetic substrate, a soft magnetic underlayer, an orientation control layer, a perpendicular magnetic layer, and a protection layer that are arranged in this order,
wherein the perpendicular magnetic layer includes a first magnetic layer and a second magnetic layer that are arranged in this order on the orientation control layer,
wherein the first magnetic layer has a granular structure including an oxide at grain boundary parts of magnetic grains,
wherein the second magnetic layer is closest to the protection layer among layers within the perpendicular magnetic layer,
wherein the second magnetic layer includes magnetic grains made of a CoCrPt alloy, and a nitride of carbon, and
wherein the nitride of carbon precipitates into the magnetic grains.

2. The magnetic recording medium as claimed in claim 1, wherein the second magnetic layer includes the nitride of carbon in a range of 1 mol % to 50 mol % at grain boundary parts of the magnetic grains made of the CoCrPt alloy.

3. The magnetic recording medium as claimed in claim 1, wherein the oxide is an oxide of an element selected from a group consisting of silicon, chromium, titanium, tantalum, aluminum, yttrium, boron, magnesium, tungsten, and cobalt.

4. The magnetic recording medium as claimed in claim 1, wherein the magnetic grains made of the CoCrPt alloy includes no boron.

5. The magnetic recording medium as claimed in claim 1, wherein the second magnetic layer includes no oxide.

6. The magnetic recording medium as claimed in claim 1, wherein the second magnetic layer has a granular structure including the nitride of carbon at grain boundary parts of the magnetic grains made of the CoCrPt alloy, and wherein the magnetic grains made of the CoCrPt alloy includes the nitride of carbon in a range of 1 mol % to 8 mol %.

7. The magnetic recording medium as claimed in claim 1, wherein the oxide is an oxide of an element selected from a group consisting of aluminum, yttrium, magnesium, tungsten, and cobalt.

8. The magnetic recording medium as claimed in claim 1, wherein
the perpendicular magnetic layer includes a plurality of layers arranged between the orientation control layer and the first magnetic layer, and
the plurality of layers include magnetic layers and nonmagnetic layers which are alternately arranged on the orientation control layer.

9. The magnetic recording medium as claimed in claim 8, wherein each of the magnetic layers of the plurality of layers has a granular structure including an oxide at grain boundary parts of magnetic grains.

10. The magnetic recording medium as claimed in claim 9, wherein the perpendicular magnetic layer further includes a nonmagnetic layer arranged between the first magnetic layer and the second magnetic layer.

11. A magnetic storage apparatus comprising:
the magnetic recording medium according to claim 1; and
a magnetic head configured to write information to and read information from the magnetic recording medium.

12. The magnetic storage apparatus as claimed in claim 11, wherein the second magnetic layer of the magnetic recording medium includes the nitride of carbon in a range of 1 mol % to 50 mol % at grain boundary parts of the magnetic grains made of the CoCrPt alloy.

13. The magnetic storage apparatus as claimed in claim 11, wherein the oxide is an oxide of an element selected from a group consisting of silicon, chromium, titanium, tantalum, aluminum, yttrium, boron, magnesium, tungsten, and cobalt.

14. The magnetic storage apparatus as claimed in claim 11, wherein the magnetic grains made of the CoCrPt alloy includes no boron.

15. The magnetic storage apparatus as claimed in claim 11, wherein the second magnetic layer of the magnetic recording medium includes no oxide.

16. The magnetic storage apparatus as claimed in claim 11,
wherein the second magnetic layer of the magnetic recording medium has a granular structure including the nitride of carbon at grain boundary parts of the magnetic grains made of the CoCrPt alloy, and
wherein the magnetic grains made of the CoCrPt alloy includes the nitride of carbon in a range of 1 mol % to 8 mol %.

17. The magnetic storage apparatus as claimed in claim 11, wherein the oxide is an oxide of an element selected from a group consisting of aluminum, yttrium, magnesium, tungsten, and cobalt.

18. The magnetic storage apparatus as claimed in claim 11, wherein
the perpendicular magnetic layer of the magnetic recording medium includes a plurality of layers arranged between the orientation control layer and the first magnetic layer, and
the plurality of layers include magnetic layers and nonmagnetic layers which are alternately arranged on the orientation control layer.

19. The magnetic storage apparatus as claimed in claim 18, wherein each of the magnetic layers of the plurality of layers has a granular structure including an oxide at grain boundary parts of magnetic grains.

20. The magnetic storage apparatus as claimed in claim 19, wherein the perpendicular magnetic layer further includes a nonmagnetic layer arranged between the first magnetic layer and the second magnetic layer.

* * * * *